United States Patent [19]

Hoffman

[11] Patent Number: 4,608,564

[45] Date of Patent: Aug. 26, 1986

[54] APPARATUS FOR THE REMOTE MONITORING OF METERS AND OTHER DEVICES

[75] Inventor: Gary R. Hoffman, Glen Arm, Md.

[73] Assignee: General Services Engineering, Inc., Baltimore, Md.

[21] Appl. No.: 439,921

[22] Filed: Nov. 8, 1982

[51] Int. Cl.[4] .............................................. G08S 23/00
[52] U.S. Cl. ................................. 340/870.02; 324/157; 324/207; 340/870.32
[58] Field of Search ....................... 340/870.02, 870.03, 340/870.31, 870.32, 870.35; 324/207, 208, 157

[56] References Cited

U.S. PATENT DOCUMENTS

| 2,403,889 | 7/1946 | Di Toro | 340/870.03 |
| 2,403,890 | 7/1946 | Johnson | 340/870.03 |
| 3,176,241 | 3/1965 | Hogan | 340/208 |
| 3,656,112 | 4/1972 | Paull | 340/870.02 |
| 3,750,122 | 7/1973 | Maeda | 340/870.02 |
| 4,032,906 | 6/1977 | Jackson, Jr. | 340/870.02 |
| 4,121,147 | 10/1978 | Becker | 324/157 |
| 4,296,411 | 10/1981 | Romanelli | 340/870.02 |
| 4,491,789 | 1/1985 | Benbow | 324/157 |

FOREIGN PATENT DOCUMENTS 1163200 2/1964 Fed. Rep. of Germany ..................... 340/870.32

Primary Examiner—John W. Caldwell, Sr.
Assistant Examiner—Michael F. Heim
Attorney, Agent, or Firm—Leonard Bloom

[57] ABSTRACT

An improved pick-up means for the remote monitoring of a rotating shaft, or a wheel mounted on the shaft, utilizes the inductive coupling effect between an aperture formed in an annular conductive member and at least one pair of coils or inductors fixedly mounted radially of the annular member. As applied to the remote monitoring of a standard electric service meter, the annular member comprises a metallic rim on the circumference of a plastic disc mounted on a shaft which is journaled within the top front panel of the meter, concentrically within the unit decade dial. Preferably, three inductors are employed, including first and second inductors and a third common inductor therebetween, thereby forming two pairs of inductors; and the signal is generated in the third common inductor whenever a respective aperture on the rim of the disc circumferentially bridges a respective pair of inductors at a predetermined position of the disc.

8 Claims, 10 Drawing Figures

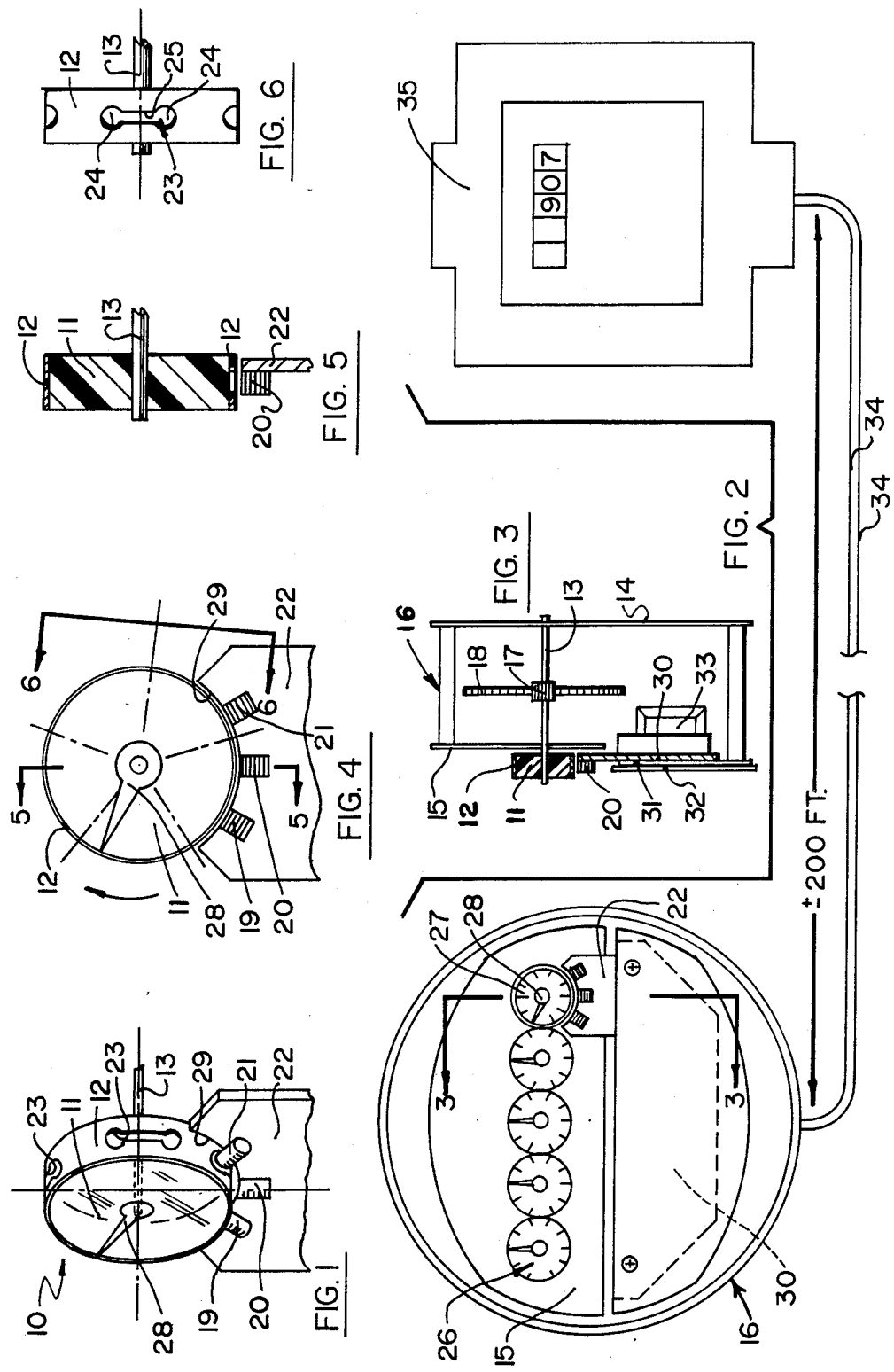

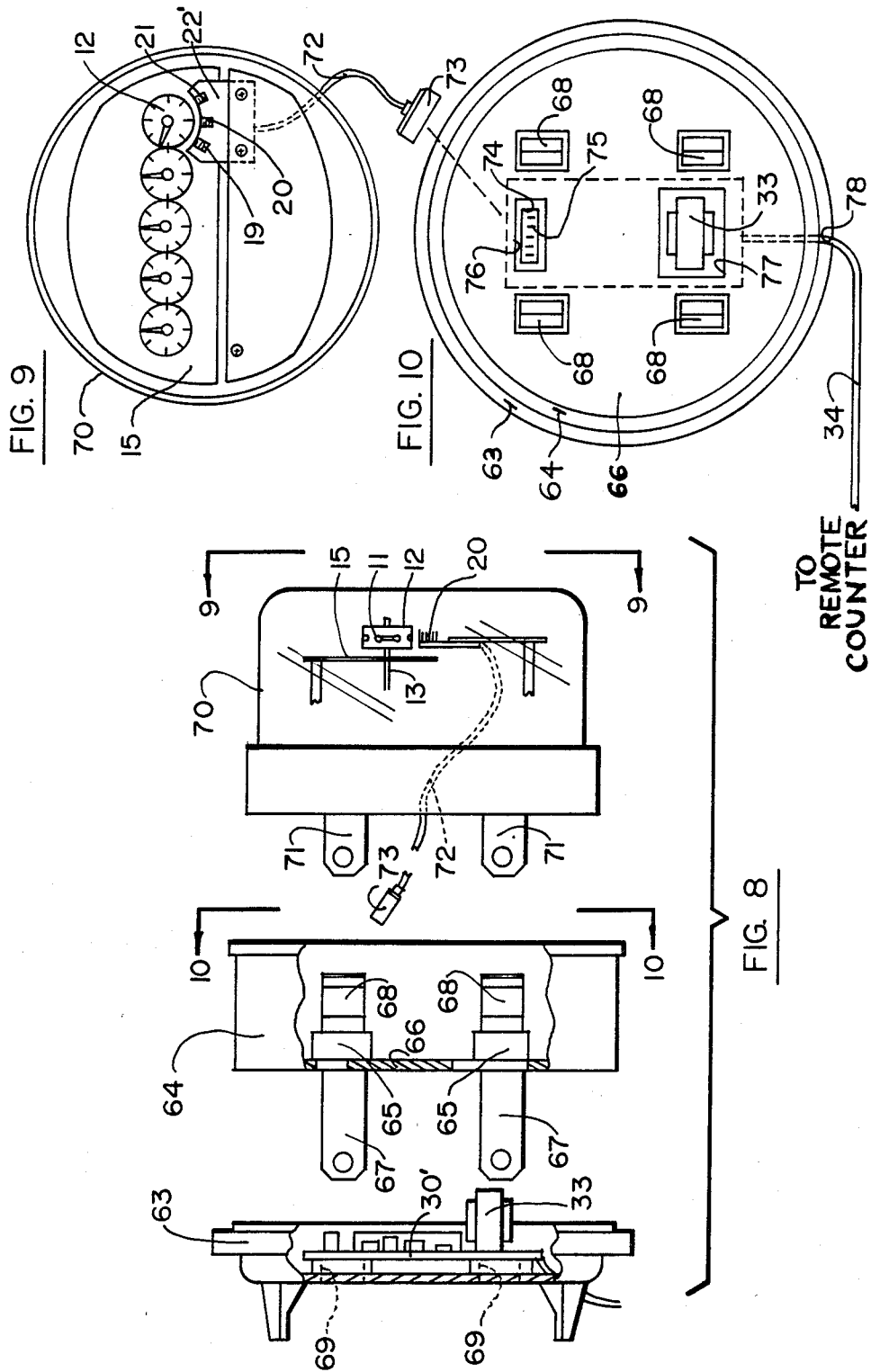

APPARATUS FOR THE REMOTE MONITORING OF METERS AND OTHER DEVICES

CROSS-REFERENCE TO RELATED APPLICATION

The present application constitutes an improvement to my co-pending application identified as Ser. No. 374,626, filed May 3, 1982, and entitled "Remote Monitoring System".

FIELD OF THE INVENTION

The present invention relates to remote means for monitoring the position of a shaft, or for monitoring the position of a wheel mounted on a rotating shaft, and more particularly, to an improved means for remotely monitoring the kilowatt hours recorded by the dial register of a standard electric service meter found in most homes as well as in commercial and industrial establishments.

BACKGROUND OF THE INVENTION

In the aforesaid co-pending application, a remote monitoring system is disclosed having a pick-up means which utilizes the inductive coupling between a pair of coils or inductors, one of which is energized, to generate a signal in the other inductor. The inductive coupling is effected by an aperture formed in a wheel or disc mounted on a shaft for conjoint rotation. In the preferred embodiment disclosed therein, the aperture comprises a radial slot in the wheel, and the signal is generated whenever the slot is alined circumferentially with the pair of inductors. The signal is amplified and shaped by electronic circuitry to produce a suitable pulse. The pulses are counted by a remote means, such as a digital read-out counter, mounted on the outside of the building. As applied to a meter, the wheel is mounted on a rotating shaft, and the shaft is journaled in a panel concentrically within the unit decade dial of the meter. Preferably, two pairs of inductors are employed, and five slots are formed in the wheel, thereby generating a total of ten pulses or counts for each complete revolution of the wheel.

In this co-pending application, the pairs of inductors are fixedly mounted axially of the rotating wheel, that is, in a plane (or planes) parallel to the wheel. Moreover, the inductor pairs and the associated electronic circuitry are contained on a printed circuit board preferably mounted on the back of the panel and between the panel and the wheel.

SUMMARY OF THE INVENTION

Accordingly, it is an object of the present invention to improve upon the aforesaid co-pending application by more readily facilitating its implementation to a standard electric service meter.

It is another object of the present invention to reduce manufacturing and fabricating costs, facilitate installation on a retrofit basis out in the field, and simplify any subsequent maintenance that may be required.

It is yet another object of the present invention to be fully compatible with various adapters, which are widely used for special conversions involving other metering problems.

In accordance with the teachings of the present invention, an annular conductive member is insulatingly mounted on the shaft for conjoint rotation therewith. The member has at least one aperture formed therein. At least one pair of inductors are fixedly mounted, radially of the member. Means are provided for energizing at least one of the inductors; and further means are provided, responsive to a substantial bridging of the inductors by the aperture, to generate a signal in the other inductor at a predetermined circumferential position of the member. Still further means are provided, responsive to the signal, for providing an indication of the position of the shaft.

In accordance with the further teachings of the present invention, the annular member comprises a metallic rim on the circumference of a dielectric disc carried by the shaft. A plurality of spaced-apart slotted apertures are formed on the rim, preferably a total of five, for cooperation with two pairs of inductors fixedly mounted radially of the rim. With this arrangement, a total of ten signals are generated for each complete revolution of the disc. The signals are amplified and shaped by circuit means to provide suitable pulses, and the pulses are counted or registered on a remote means, such as a remote digital read-out counter.

As applied to a standard electric service meter, the disc is mounted on a shaft which is journaled within the front panel (of the meter) concentrically within its unit decade dial. The disc is disposed forwardly of the panel and is substantially alined, coaxially, with the unit decade dial. The circuit means is contained on a printed circuit ("p.c.") board mounted on the meter. In one embodiment, the p.c. board is mounted in back of the lower portion of the front panel of the meter, and the inductors are mounted directly on the board. In another embodiment, the p.c. board is mounted on an adapter (for the meter) and the inductors are connected to the p.c. board by a ribbon cable.

These and other objects of the present invention will become apparent from a reading of the following specification, taken in conjunction with the enclosed drawings.

BRIEF DESCRIPTION OF THE DRAWINGS

FIG. 1 is a perspective of the improved pick-up means of the present invention, showing the annular rim on the rotating disc, the plurality of apertures on the disc, and the inductors fixedly mounted radially of the rim.

FIG. 2 is an exploded view, showing the present invention applied to a standard meter, and further showing the conductors leading to a remote digital read-out counter.

FIG. 3 is a section view, taken across the lines 3—3 of FIG. 2, showing the disc mounted on the rotating shaft forwardly of the unit decade dial on the meter, and further showing (one of) the inductors on a printed circuit board mounted on the lower portion of the front panel for the meter.

FIG. 4 is a front elevation of the disc and the inductors, the intermediate inductor being common to the other two and forming therebetween two pairs of inductors, and the broken radial lines on the disc illustrating (schematically) the location of the five spaced-apart apertures formed on the annular rim on the disc.

FIG. 5 is a section view, taken across the lines 5—5 of FIG. 4, showing the disc formed from a dielectric material, the annular metallic rim thereon, and one of the inductors radially of the rim and fixedly mounted on the printed circuit board.

FIG. 6 is a view, taken along the lines 6—6 of FIG. 4, showing the plan outline of one of the apertures in the rim.

FIG. 8 is an exploded cut-away view illustrating the implementation of the present invention to a two-piece adapter presently used for special conversions involving other metering problems.

FIG. 9 is a view taken along the lines 9—9 of FIG. 8, showing the respective inductors on a board mounted on the meter.

FIG. 10 is a view taken along the lines 10—10 of FIG. 8, showing the p.c. board mounted between the base and the collar portions of the adapter.

DESCRIPTION OF THE PREFERRED EMBODIMENT

Figure 7:
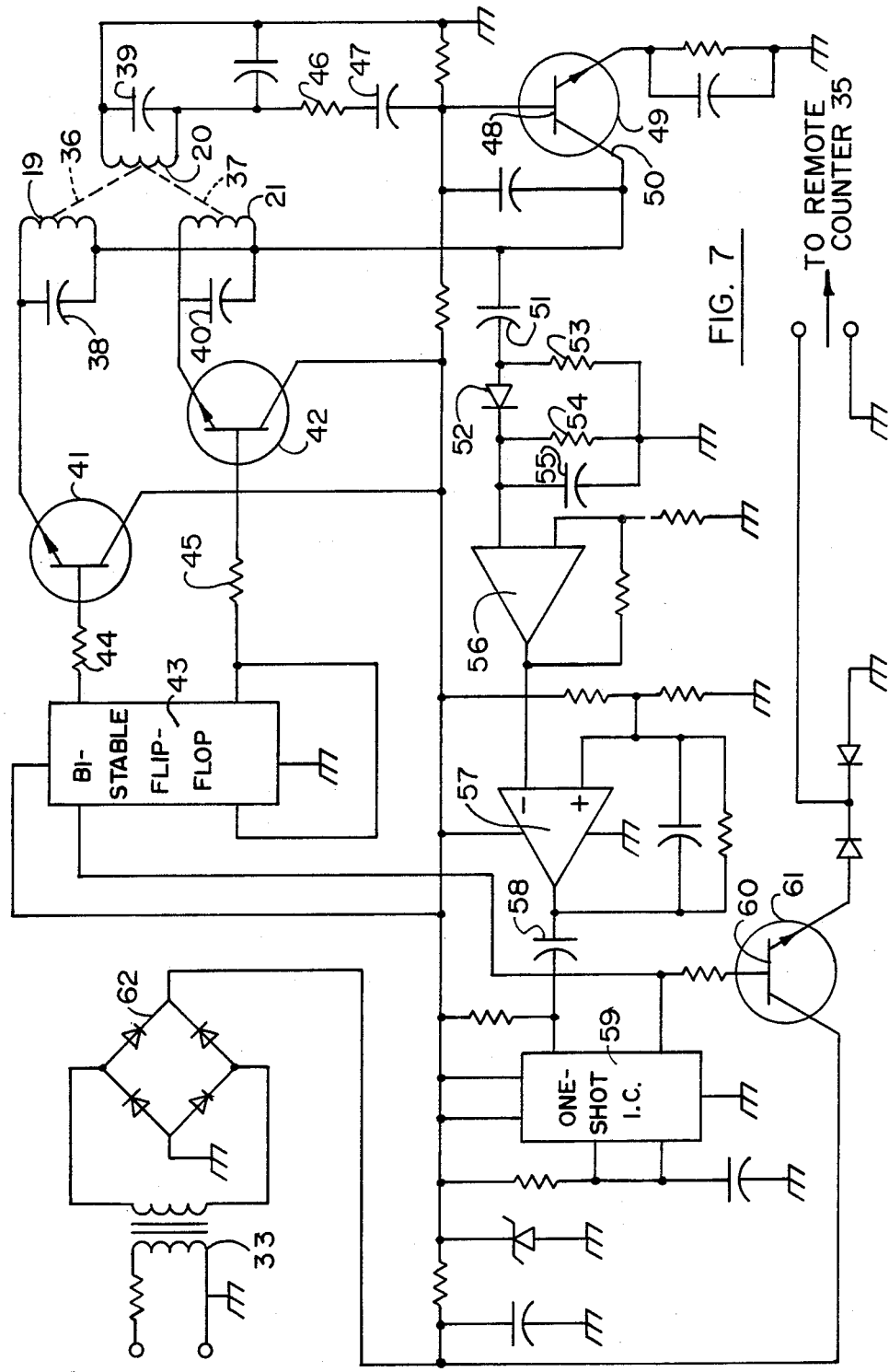
FIG. 7 is a schematic diagram of the preferred electronic circuitry on the p.c. board, the broken lines illustrating the inductive coupling between respective first and second inductors and a third common inductor, whenever a respective inductor is energized, and whenever a respective aperture on the rim substantially bridges the respective energized inductor with the third common inductor.

With reference to FIGS. 1-6, there is illustrated a preferred embodiment 10 of the pick-up means of the present invention. This embodiment comprises a disc 11 having a metallic annular rim 12 mounted on its circumference. The disc is made from a suitable insulating or dielectric material, such as molded plastic, and the rim may be made from a thin copper sheet rolled into an annular shape and adhesively secured to the disc. However, other construction techniques are feasible consonant with the teachings of the present invention. With this in mind, the disc is press-fitted or otherwise suitably mounted on a shaft 13 for conjoint rotation therewith. The shaft is journaled between the back panel 14 and the top front panel 15 of the meter 16, as shown in FIG. 3, and the disc is disposed forwardly of the top front panel. A pinion gear 17 is carried by the shaft for cooperation with a spur gear 18. This spur gear is part of a gear train within the meter; this gear train is conventional, however, and hence has been omitted for ease of illustration.

A plurality of coils or inductors 19, 20 and 21 are fixedly mounted on a plate (or board) 22 radially of the rim. Inductors 19 and 21 comprise first and second inductors, respectively, and inductor 20 therebetween is a third or common inductor. Thus, two pairs of respective inductors 19, 20 and 20, 21 are provided. A plurality of spaced-apart arcuately-formed apertures 23 are formed on the rim for cooperation with the respective pairs of inductors. Preferably, and as shown more clearly in FIG. 6, each aperture 23 comprises a round opening or hole 24 joined by a slot 25.

Means are provided, as hereinafter described, for sequentially energizing one of the inductors 19 and 21; and at a predetermined circumferential position of the disc, one of the apertures on the rim bridges inductors 19, 20 or 20, 21, thereby effecting an inductive coupling between the respective inductor pairs 19, 20 or 20,21, and thereby generating a signal in the third common inductor 20. Means are further provided, as hereinafter described, for amplifying and shaping the signal to produce a pulse, and the pulses are registered on a remote means, thereby monitoring the position of the disc and the shaft on which the disc is mounted.

With reference again to FIG. 2, the meter 16 is a standard service electric meter (for use in households as well as in commercial and industrial establishments) and has a plurality of decade dials 26, including a unit decade dial 27, on its top front panel 15. The disc 12 is mounted forwardly of the unit decade dial and is substantially alined (coaxially) therewith, as shown more clearly in FIG. 2. A pointer 28 is carried on the face of the disc; this pointer may simply be painted on the disc, if desired. As previously noted, the inductors are mounted on a plate which, as shown more clearly in FIG. 4, has a concave surface 29 complementary to the circumference of the disc and spaced closely thereto. The respective axes of the three inductors are disposed substantially radially of the disc, and the inner end portions of the inductors are substantially alined, circumferentially, with respect to one another and are disposed closely to the rim on the rotating disc.

The plate 22 (on which the three inductors are mounted) constitutes an integral upper projecting portion of a printed circuit board (or "p.c."board) 30. This p.c. board is mounted by suitable means (including a "stand-off" 31) to the back of the bottom front panel 32 of the meter. The p.c. board carries a transformer 33 (and electronic circuit means, as hereinafter described). A pair of wires 34 (or other suitable conductors) connect the output of the circuit means on the p.c. board to a remote register or other remote monitoring means. Preferably, this remote register comprises a digital read-out counter 35. This counter may be mounted on the outside of the building (not shown) to facilitate a remote reading of the meter. In a preferred embodiment, the wires may extend for up to two hundred (200) feet.

With reference to the schematic diagram of FIG. 7, the electronic circuit means is quite similar to that which is illustrated and claimed in the aforesaid copending application, and thus will be described generally herein. With this in mind, the inductive coupling between the respective inductor pairs 19, 20 and 20, 21—which is due to the sequential energization of one of the inductors (19 or 21) and the substantially simultaneous bridging of a respective inductor pair by one of the apertures 23, at a predetermined circumferential position of the disc 12—is illustrated by the broken lines 36 and 37, respectively. Each of the inductors 19, 20 and 21 is provided with a resonating capacitor 38, 39 and 40, respectively. The inductor pairs 19, 20 and 20, 21, respectively, are sequentially energized by oscillator drive switches, comprising respective switching transistors 41 and 42 controlled by a bi-stable flip-flop 43 through respective resistors 44 and 45. The signal from the common inductor 20 constitutes a pulse fed via resistor 46 and capacitor 47 to the base 48 of a transistor oscillator 49. The collector 50 of transistor 49 is connected via a diode 51 to a detector network which comprises a diode 52, resistors 53 and 54, and capacitor 55. The detector is connected to an operational amplifier 56 and thence to a Schmitt trigger 57, the output of which is connected via a capacitor 58 to trigger a "one-shot" integrated circuit 59. The output of this "I.C." 59 is fed to the base 60 of a transistor driver 61, the emitter output of which provides a suitably shaped and amplified pulse. This pulse is registered (or "counted") by the remote digital read-out counter 25 or other suitable means. Finally, the power supply includes the transformer 33 and a full-wave rectifier bridge 62.

With reference to FIGS. 8-10, the implementation of the present invention to a typical meter adapter is shown. The adapter, which is widely used, includes a base member 63 and a collar member 64. Preferably, these members are annular and are molded from a suitable material having relatively-high strength and good electrical insulating qualities. In the final assembly, the collar is seated on the base; and if desired, the complementary circumferential edges therebetween may be joined by a suitable composition, such as a room-temperature vulcanizable ("RTV") material (not shown) for sealing purposes. Terminals 65 are mounted in the bottom plate 66 of the collar; these terminals have male prongs 67 and female receptacles 68. The male prongs extend through slots 69 in the base member 63 for plugging into an existing (older) meter installation (not shown). The new meter 70 to be installed (which is substantially similar to the meter 16 shown in FIG. 2) has prongs 71 received within the receptacles 68 on the adapter terminals. A total of four terminals may be provided, as shown more clearly in FIG. 10. With this arrangement, the "old" meter (not shown) may be removed from an existing meter installation; the adapter may be plugged into the existing installation; and the "new" meter 70 may be plugged into the adapter. The particular adapter shown herein is manufactured and sold by Ekstrom Industries, Inc. (as model no. 37-4JHRG3). However, it will be appreciated by those skilled in the art that the present invention is not restricted to the particular adapter shown herein, but is equally applicable to a wide variety of adapters.

In this FIG. 8–10 embodiment of the present invention, the plate (on which the inductors 19–21 are mounted) is not formed integrally with the p.c. board 30 (as in the embodiment of FIGS. 1–6) but rather is a separate plate (or board) 22', as shown more clearly in FIG. 9. Preferably, the plate 22' is adhesively secured in place. The inductors 19–21 on plate 22' are connected by a flexible ribbon cable 72 carrying a female-type of plug 73 on its end. This plug is connected to a male-type of receptacle 74, which preferably has five prongs 75 (as shown more clearly in FIG. 10). The prongs in the receptacle are accessible via a rectangular opening 76 formed in the bottom 66 of the collar member; and the plug 73 on the end of the ribbon cable 72 may be plugged into the receptacle 74, prior to plugging the meter into the adapter. The receptacle is mounted on a p.c. board 30', which is similar to the p.c. board 30 of the embodiment shown in FIGS. 1–6. This p.c. board 30' is mounted on the base member 63 (as shown in FIG. 8). The transformer 33 extends through a clearance opening 77 and into the bottom 66 of the collar 64 (without interfering with the meter 70). However, it will be appreciated by those skilled in the art that other means for mounting the p.c. board 30' in the adapter (or in other adapters having a similar purpose) may be employed and are fully compatible with the teachings of the present invention. Finally, the wires 34 connected to the p.c. board 30' (and leading to the remote counter 35) pass through an opening 78 formed in the annular collar 64.

Obviously, many modifications may be made without departing from the basic spirit of the present invention. Accordingly, it will be appreciated by those skilled in the art that within the scope of the appended claims, the invention may be practiced other than has been specifically described herein.

I claim:

1. In a meter having a rotating shaft, a remote monitoring apparatus comprising a disc made of a dielectric material, means for mounting the disc on the shaft for conjoint rotation therewith, an annular metallic rim mounted on the circumference of the disc, the rim having five spaced-apart arcuately-formed slotted apertures formed therein, two pairs of inductors fixedly mounted on the meter radially of the rim, means for sequentially energizing the pairs of inductors, means for generating a signal whenever one of the apertures in the rim bridges one of the pairs of inductors at a predetermined circumferential position of the disc, said last-named means including electronic circuit means mounted on a printed circuit board for providing a count, whereby a total of ten counts are provided for each complete revolution of the disc, and a remote means for registering the count.

2. In a meter having a panel provided with a plurality of dials, including a unit decade dial, and further having a rotating shaft journaled in the panel concentrically within the unit decade dial, a remote monitoring apparatus comprising a disc made of a dielectric material and mounted on the shaft for conjoint rotation therewith, the disc being disposed forwardly of the panel, adjacent to the unit decade dial and substantially concentric thereto, an annular metallic rim mounted on the circumference of the disc, the rim having a plurality of spaced-apart arcuately-formed slotted apertures, a pair of inductors fixedly mounted on the meter radially of the rim, a third inductor fixedly mounted on the meter intermediately of the pair of inductors and common thereto, means for sequentially energizing one and the other of the pair of inductors, whereby a signal is generated in the third common inductor whenever one of the apertures in the rim bridges the third common inductor with one or the other inductors in the pair of inductors, circuit means responsive to the signal for generating a count, and means remote from the meter for registering the count.

3. In combination with a meter having a panel provided with a plurality of decade dials, including a unit decade dial, and further having a shaft journaled in the panel substantially concentrically of the unit decade dial, and wherein an adapter is provided for the meter, the adapter including a base and a collar removably joined together, respective terminal means carried by the base and collar, means for plugging the terminals on the base into an existing installation, and means for plugging the meter into the terminals on the collar, the improvement which comprises a disc made of a dielectric material, means for mounting the disc on the shaft for conjoint rotation therewith forwardly of the unit decade dial on the panel, a metallic rim on the circumference of the disc, the rim having five spaced-apart arcuately-formed apertures formed thereon, two pairs of inductors fixedly mounted radially of the rim and comprising first and second inductors and a third common inductor therebetween, means for sequentially energizing the first and second inductors, whereby a signal is generated in the third common inductor whenever one of the apertures bridges one of the first and second inductors with the third common inductor at a predetermined circumferential position of the disc, and whereby a total of ten signals are generated for each complete revolution of the disc, a printed circuit board mounted between the base and collar of the adapter, means including a ribbon cable connecting the inductors to the printed circuit board, circuit means carried by the printed circuit board and responsive to the signals for generating respective counts, means remote from the meter for registering the counts, and conductor means running from the printed circuit board to the remote means.

4. The improvement of claim 3, wherein the remote means comprises a digital read-out counter.

5. The improvement of claim 3, wherein the collar has an opening formed therein, and wherein the conductor means passes through the opening.

6. In a remote monitoring means for a meter or other device, the combination of a rotating member, first, second and third inductors fixedly mounted in juxtaposition to the rotating member, the third inductor being positioned intermediately of the first and second inductors and being common thereto, thereby forming two pairs of inductors, means including a pair of oscillator drive switches, one for each pair of inductors, for sequentially energizing the first and second inductors, respectively, and aperture means carried by the rotating member and cooperating with the respective inductor pairs, at a predetermined circumferential position of the rotating member and in timed relationship to the sequential energization of the respective first and second inductors, to generate a signal in the third inductor.

7. The combination of claim 6, further including circuit means responsive to the signal for producing a pulse, and remote means for counting the pulses produced.

8. In a remote monitoring means for a meter or other device, the combination of a rotating member, first, second and third inductors fixedly mounted in juxtaposition to the rotating member, the third inductor being positioned intermediately of the first and second inductors and being common thereto, thereby forming two pairs of inductors, means including a pair of oscillator drive switches, one for each pair of inductors, for sequentially energizing the first and second inductors, respectively, means carried by the rotating member and cooperating with the respective inductor pairs, at a predetermined circumferential position of the rotating member and in timed relationship to the sequential energization of the respective first and second inductors, to generate a signal in the third inductor, wherein the rotating member comprises a plastic disc, the respective inductors being disposed radially of the disc, and the respective inductors being substantially aligned, circumferentially, with respect to one another, and wherein the means carried by the disc for cooperation with the respective inductor pairs comprises an annular metallic rim mounted on the circumference of the disc, the rim having a plurality of arcuately-shaped spaced-apart closed slotted apertures formed thereon, whereby a respective inductor pair will be inductively coupled together whenever one of the apertures on the rim substantially bridges, circumferentially, the respective inductor pairs.

* * * * *